(12) United States Patent  
Kato et al.

(10) Patent No.: US 7,245,505 B2
(45) Date of Patent: Jul. 17, 2007

(54) LAMINATED ELECTRONIC COMPONENT

(75) Inventors: Mitsuhide Kato, Sabae (JP); Yoshikazu Chigodo, Fukui (JP); Keiji Ogawa, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 258 days.

(21) Appl. No.: 10/633,701

(22) Filed: Aug. 5, 2003

(65) Prior Publication Data

US 2004/0043190 A1 Mar. 4, 2004

(30) Foreign Application Priority Data

Sep. 4, 2002 (JP) .............................. 2002-259156

(51) Int. Cl.
- H05K 7/02 (2006.01)
- H05K 7/06 (2006.01)
- H05K 7/08 (2006.01)
- H05K 7/10 (2006.01)

(52) U.S. Cl. .................. 361/780; 361/760; 361/792
(58) Field of Classification Search .................. None
See application file for complete search history.

(56) References Cited

U.S. PATENT DOCUMENTS

| 6,021,050 | A * | 2/2000 | Ehman et al. ............... 361/793 |
| 6,057,600 | A * | 5/2000 | Kitazawa et al. ............ 257/728 |
| 6,163,456 | A * | 12/2000 | Suzuki et al. ................. 361/704 |
| 6,477,057 | B1 * | 11/2002 | Buffet et al. ................. 361/780 |
| 6,555,763 | B1 * | 4/2003 | Hirasawa et al. ............ 174/264 |
| 6,657,130 | B2 * | 12/2003 | Van Dyke et al. ........... 174/255 |
| 6,800,814 | B2 * | 10/2004 | Ohsaka ........................ 174/255 |
| 6,860,006 | B2 | 3/2005 | Sakai et al. .................... 29/852 |
| 6,937,480 | B2 * | 8/2005 | Iguchi et al. ................. 361/780 |
| 6,970,362 | B1 * | 11/2005 | Chakravorty ................ 361/782 |
| 2004/0017670 | A1 * | 1/2004 | Bando ......................... 361/761 |

FOREIGN PATENT DOCUMENTS

| CN | 1314776 A | 9/2001 |
| JP | 58-97830 | 7/1983 |
| JP | 08-316086 | 11/1996 |
| JP | 2001-267448 | 9/2001 |
| KR | 1998-063999 | 10/1998 |
| KR | 2000-0023266 | 4/2000 |

OTHER PUBLICATIONS

Official communication issued in the corresponding Chinese Patent Application No. 03159328.3, mailed on Mar. 31, 2006.
Official Communication dated Oct. 31, 2005, issued in the corresponding Korean Patent Application No. 10-2004-0061425. (with English translation).

* cited by examiner

*Primary Examiner*—Tuan Dinh
(74) *Attorney, Agent, or Firm*—Keating & Bennett, LLP

(57) ABSTRACT

A laminated electronic component includes a laminated block in which a plurality of electrically insulating layers are laminated. An external conductor film is disposed on a surface of the laminated block. An additional conductor film which is at the same potential as the external conductor film is arranged such that it faces the external conductor film with an insulating layer disposed therebetween. The additional conductor film and the external conductor film are electrically connected to each other through a via-hole conductor so that they are at the same potential.

18 Claims, 5 Drawing Sheets

LAMINATED ELECTRONIC COMPONENT

BACKGROUND OF THE INVENTION

1. Field of the Invention

The present invention generally relates to laminated electronic components, and more particularly to a laminated electronic component provided with an external conductor film on an exposed exterior surface.

2. Description of the Related Art

FIG. 5 is a sectional view illustrating a known laminated electronic component 1 disclosed in Japanese Unexamined Patent Application Publication No. 2001-267448.

The laminated electronic component 1 is mounted on a board 2 indicated by an imaginary line and is provided with a laminated block 4. The laminated block 4 is formed by laminating a plurality of electrically insulating layers 3 along a thickness direction of the laminated block 4. The insulating layers 3 are generally formed of ceramic material.

The laminated block 4 is provided with a cavity 7 having an opening 6 at least on one main surface, for example, on a first main surface 5 facing the mounting board 2. In the cavity 7, a chip component 8, for example, an IC chip or a surface acoustic wave (SAW) filter, is stored therein. The cavity 7 may sometimes be filled with an electrically insulating resin after receiving the chip component 8 therein, though it is not shown.

Several internal conductor films and several via-hole conductors are disposed within the laminated block 4 so as to provide wiring patterns required for the laminated electronic component 1, though details of such an arrangement are not shown. These internal conductor films and via-hole conductors are sometimes disposed in the laminated block 4 such that they form capacitors, inductors, delay lines, or filters. Within the laminated block 4, not only the internal conductor films, but also resistor films for defining resistors may be provided.

In FIG. 5, there is shown in which a pair of capacitor-forming conductor films 9 and 10 for defining a capacitor are disposed as the internal conductor films such that they face each other with a specific insulating layer 3 therebetween. In the laminated block 4, the first main surface 5, a second main surface 11 facing the first main surface 5, and a bottom surface 12 of the cavity 7 are exposed on the exterior of the insulating layers 3. An external conductor film 3 is provided on the first main surface 5, an external conductor film 14 is provided on the second main surface 11, and an external conductor film 15 is provided on the cavity 12.

The external conductor film 13 functions as a conductive land for establishing an electrical connection with the board (motherboard) 2 on which the laminated electronic component 1 is mounted. The external conductor film 14 functions as a conductive land for establishing an electrical connection with a chip component 16 mounted on the second main surface 11. The external conductor film 15 provides a die bonding surface for bonding the chip component 8 housed in the cavity 7.

The chip components 16 mounted on the second main surface 11 of the laminated block 4 include electronic components defining capacitors, inductors, resistors, diodes, ICs, memory devices, SAW filters, or quartz oscillators.

A certain impact is imposed on the external conductor films 13, 14, and 15 on the following respective occasions: when the laminated electronic component 1 is mounted on the board 2, when the chip components 16 are mounted, and when the chip component 8 is mounted. A stress resulting from such an impact may cause cracks in the insulating layers 3 positioned adjacent to the external conductor films 13, 14, and 15. Particularly, such cracks easily occur when the insulating layers 3 are formed of ceramics. Cracks may also occur, for example, when the laminated electronic component 1 is dropped or when it collides with another component.

When cracks occur in ceramics positioned adjacent to the external conductor films 13, 14, and 15 as described above, the following problems may arise.

It is now assumed, for example, that a crack occurs in the insulating layer 3 adjacent to the external conductor layer 15, and in this state, the laminated electronic component 1 is used while a ground potential is supplied to the external conductor film 15. In this case, since a constant DC bias is applied between the external conductor film 15 and, for example, the capacitor-forming conductor film 10, migration of metal materials forming the external conductor film 15 and the capacitor-forming conductor film 10 may be facilitated therebetween, causing short-circuiting or leakage, thereby impairing the functions of the laminated electronic component 1. The above-described problem also applies to the external conductor films 13 and 14.

SUMMARY OF THE INVENTION

In order to overcome the problems described above, preferred embodiments of the present invention provide a laminated electronic component including a laminated block having a structure in which a plurality of electrically insulating layers and an internal conductor film formed along a specific interface between the insulating layers are laminated along the thickness of the laminated block, an external conductor film disposed on a surface exposed on the exterior of the laminated block, and an additional conductor film which is at the same potential as the external conductor film and which is arranged along a specific interface between the insulating layers such that the additional conductor film faces the external conductor film.

With this unique configuration, even if cracks occur in the insulating layer adjacent to the external conductor film, an electric field is not generated between the external conductor film and the additional conductor film since they are at the same potential, thereby preventing the occurrence of migration of metal materials therebetween. As a result, failures, such as short-circuiting and leakage, in the laminated electronic component are reliably prevented.

The additional conductor film also prevents cracks from further expanding inwards into the laminated block, thereby preventing the laminated electronic component from being mechanically destroyed.

Preferably, only one of the insulating layers may be interposed between the additional conductor film and the external conductor film.

The thickness of the insulating layer between the additional conductor film and the external conductor film may preferably range from about 10 μm to about 150 μm. With this arrangement, the advantages obtained by the provision of the additional conductor film can be effectively exhibited without increasing the height of the laminated electronic component.

The area of the additional conductor film may preferably be greater than or equivalent to the area of the external conductor film, and may be formed such that the additional conductor film covers the external conductor film therein when viewed from above or below. With this arrangement, the advantages obtained by the provision of the additional conductor film can be reliably exhibited, and also, a plating liquid penetrating into the insulating layers through cracks can be effectively prevented by the additional conductor film.

The additional conductor film and the external conductor film may be electrically connected to each other via a via-hole conductor or via a conductor disposed on an outer surface of the laminated block so that they are at the same potential.

Preferred embodiments of the present invention particularly become effective when a DC bias is applied between the external conductor film and the internal conductor film when the laminated electronic component is being used. Thus, the advantages obtained by preferred embodiments of the present invention can be noticeably exhibited.

The laminated block may include a first main surface and a second main surface facing the first main surface, and the external conductor film may be disposed on at least one of the first and second main surfaces. In this case, the external conductor film may be used for establishing an electrical connection with a chip component disposed on the same surface on which the external conductor film is disposed, or may be used for establishing an electrical connection with a board (motherboard) on which the laminated electronic component is mounted.

A cavity having an opening positioned on at least one of the main surfaces of the laminated block may be provided for the laminated block, and the external conductor film may be disposed on the bottom surface of the cavity. If a chip component is housed in the cavity, the external conductor film may provide a die bonding surface for bonding the chip component.

In this case, the external conductor film and the chip component are not necessarily electrically connected to each other, and the external conductor film may be used for mechanically fixing or shielding the chip component.

With the provision of the above-described cavity, when the additional conductor film and the external conductor film are electrically connected to each other through a via-hole conductor, the via-hole conductor may preferably positioned in an area outside the bottom surface of the cavity so as to improve the flatness of the bottom surface of the cavity. With this arrangement, the possibility of allowing a plating liquid to penetrate along the via-hole conductor can be reduced, and the flatness of the bottom surface of the cavity can be enhanced without the via-hole conductor.

Preferred embodiments of the present invention particularly become effective when the insulating layers are formed of ceramics, which would normally facilitate the occurrence of cracks.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
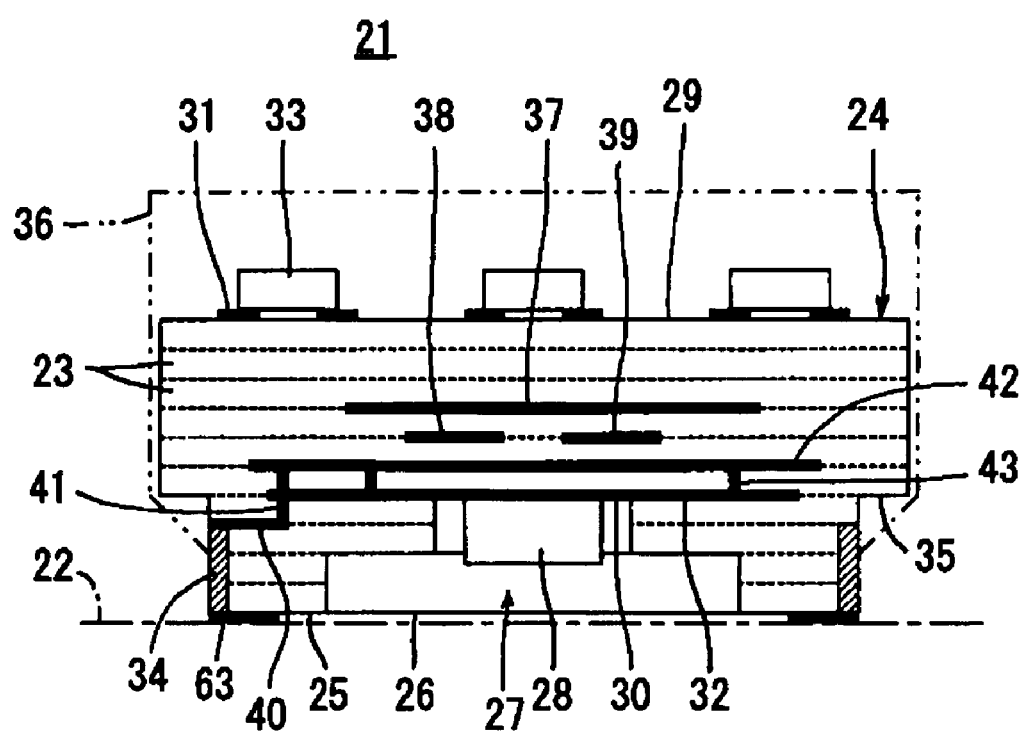
FIG. 1 is a sectional view illustrating a laminated electronic component 21 according to a first preferred embodiment of the present invention.

FIG. 1 is a sectional view illustrating a laminated electronic component 21 constructed in accordance with a first preferred embodiment of the present invention.

The laminated electronic component 21 is mounted on a board 22 indicated by an imaginary line, and is provided with a laminated block 24. The laminated block 24 is formed by laminating a plurality of electrically insulating layers 23 along the thickness of the laminated block 24. Although the insulating layers 23 are preferably formed of ceramics, they may be formed of another electrically insulating material, such as resin.

The laminated block 24 is provided with a cavity 27 having an opening 26 at least on one main surface, for example, on a first main surface 25 facing the mounting board 22. In the cavity 27, a chip component 28, for example, an IC chip or a SAW filter, is stored therein. The chip component 28 is electrically connected to a conductive land of the laminated block 24 by wire bonding or flip chip bonding (bump connection), though it is not shown in FIG. 1. The cavity 27 may be filled with an electrically insulating resin after receiving the chip component 28 therein, though it is not shown.

In the laminated block 24, the above-described first main surface 25, a second main surface 29 facing the first main surface 25, and a bottom surface 30 of the cavity 27 are extended substantially parallel with the insulating layers 23, and are also exposed on the exterior side of the insulating layers 23. An external conductor film 31 is provided on the second main surface 29, and an external conductor film 32 is provided on the bottom surface 30 of the cavity 27.

The external conductor film 31 defines a conductive land for establishing an electrical connection with a chip component 33 mounted on the second main surface 29 of the laminated block 24. The external conductor film 32 defines a die bonding surface for bonding the chip component 28 housed in the cavity 27. The external conductor film 32 extends beyond the bottom surface 30 of the cavity 27 toward the inside of the laminated block 24 so as to connect with an internal conductor film and a via-hole conductor, which are described below. Such an arrangement, however, is not essential.

The chip components 33 mounted on the second main surface 29 include electronic components defining capacitors, inductors, resistors, diodes, ICs, memory devices, SAW filters, or quartz oscillators.

At edges of the first main surface 25, terminal conductors 34, which define input/output terminals, and external conductor films 63 connected to the terminal conductors 34 are provided. The terminal conductors 34 and the external conductor films 63 are used for establishing an electrical connection with the mounting board 22. The terminal conductors 34 are formed by dividing a via-hole conductor, which is formed before the laminated blocks 24 are divided from a mother laminated block, simultaneously with dividing the mother laminated block. In this preferred embodiment, a groove for forming the above-described via-hole conductor is formed before dividing the mother laminated block into the laminated blocks 24, and steps 35 resulting from the formation of the groove are generated at side surfaces of the laminated block 24.

The terminal conductors 34 may be formed by providing a conductor, such as a conductive paste, at the side surfaces of the divided laminated block 24. The above-described conductor films 63 do not necessarily have to be formed.

The laminated electronic component 21 may be provided with a metal housing cover 36 indicated by imaginary lines. The metal housing cover 36 is fixed on the second main surface 29 of the laminated block 24 such that it covers the chip components 33. The metal housing cover 36 is soldered to the specific terminal conductor 34, such as that to which a ground potential is supplied so that it is electrically connected and mechanically fixed to the terminal conductor 34.

In the laminated block 24, several internal conductor films are disposed along the specific interfaces between the insulating layers 23, and several via-hole conductors are arranged such that they pass through the specific insulating layers 23, though details of such an arrangement are not shown. These internal conductors and via-hole conductors are arranged such that they provide wiring patterns required for the laminated electronic component 21, and so that they define capacitors, inductors, delay lines, or filters as needed or desired. Within the laminated block 24, not only the above-described internal conductor films, but also resistor films for providing resistors may sometimes be provided.

In FIG. 1, there are shown internal conductor films 37, 38, 39, and 40 as the above-described internal conductor films, and a via-hole conductor 41 as the above-described via-hole conductor.

As another characteristic configuration of preferred embodiments of the present invention, an additional conductor film 42 is provided within the laminated block 24 along a specific interface between the insulating layers 23 such that it faces the external conductor film 32. The additional conductor film 42 is electrically connected to the external conductor film 32 through via-hole conductors 43 so that it is at the same potential as the external conductor film 32. By the provision of the additional conductor film 42, the following advantages are provided.

It is now assumed that the internal conductor films 37, 38, and 39 are provided for, for example, forming capacitors, and that a ground potential is supplied to the external conductor film 32 while the laminated electronic component 21 is being used. In this case, a constant DC bias is sometimes applied to the external conductor film 32. Under this condition, even if cracks occur in the insulating layer 23 adjacent to the external conductor film 32, an electric field is not generated between the external conductor film 32 and the additional conductor film 42 since they are at the same potential, thereby preventing the occurrence of migration of metal materials therebetween. As a result, failures, such as short-circuiting and leakage, in the laminated electronic component 21 can be reliably prevented.

The additional conductor film 42 also prevents cracks from further expanding inwards into the laminated block 24.

As the thickness of the insulating layer 23 between the additional conductor film 42 and the external conductor film 32 is greater, the possibility of the occurrence of cracks becomes smaller, and accordingly, the possibility of the occurrence of migration becomes smaller. On the other hand, a greater thickness of the insulating layer 23 increases the height of the laminated electronic component 21. Thus, by considering these tradeoffs, the thickness of the insulating layer 23 between the additional conductor film 42 and the external conductor film 32 may preferably be about 10 µm to 150 µm, and more preferably about 25 µm to about 150 µm. The laminated block 24 is preferably designed such that only the single insulating layer 23 intervenes between the additional conductor film 42 and the external conductor film 32.

In order to effectively exhibit the advantages achieved by the provision of the additional conductor film 42, the additional conductor film 42 is preferably formed such that the area thereof is greater than or equivalent to that of the external conductor film 32 and such that the additional conductor film 42 covers the external conductor film 32 therein when viewed from above. With this arrangement, even if a plating liquid penetrates into the insulating layers 23 through cracks, the provision of the additional conductor film 42 can effectively inhibit further penetration of the plating liquid into the insulating layers 23.

The additional conductor film 42 is also preferably arranged such that it covers the internal conductor films 37, 38, and 39 therein when viewed from the bottom.

The via-hole conductors 43 are preferably positioned in an area outside the bottom surface 30 of the cavity 27. That is, since the via-hole conductors 43 are not disposed adjacent to the bottom surface 30 of the cavity 27, the possibility of the above-described penetration of a plating liquid through the via-hole conductors 43 can be minimized, and also, the flatness of the bottom surface 30 can be greatly improved without the via-hole conductors 43.

Figure 2:
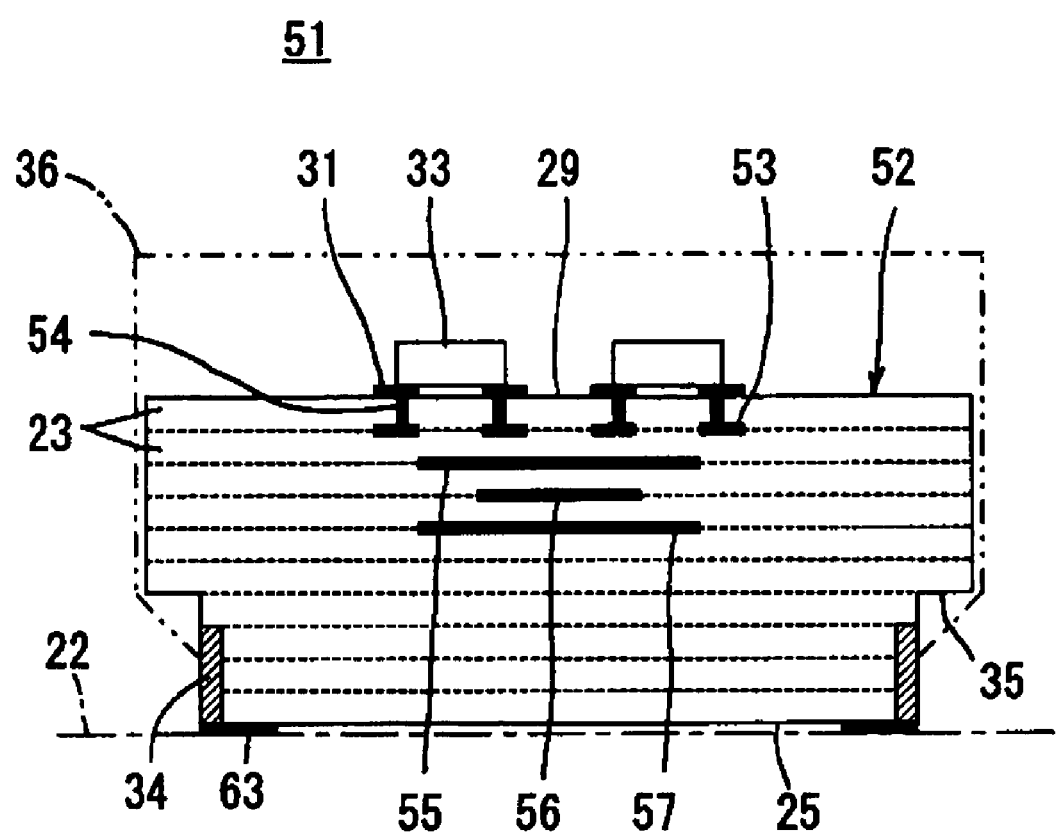
FIG. 2 is a sectional view illustrating a laminated electronic component 51 according to a second preferred embodiment of the present invention.

FIG. 2 is a sectional view illustrating a laminated electronic component 51 constructed in accordance with a second preferred embodiment of the present invention. In FIG. 2, elements equivalent to those shown in FIG. 1 are indicated by like reference numerals, and an explanation thereof is thus omitted.

In a laminated block 52 provided with the laminated electronic component 51, an additional conductor film 53 is arranged along the specific interface between the insulating layers 23 such that it faces the external conductor film 31 disposed on the second main surface 29. The additional conductor film 53 is electrically connected to the external conductor film 31 through a via-hole conductor 54 so that it is at the same potential as the external conductor film 31.

In FIG. 2, internal conductor films 55, 56, and 57 are arranged to define the internal conductor films formed within the laminated block 52. The internal conductor films 55, 56, and 57 have the function of forming capacitors or wiring, and are sometimes used while a constant DC bias is applied between the internal conductor films 55, 56, and 57 and the external conductor film 31. Accordingly, any crack occurring adjacent to the insulating layer 23 of the external conductor film 31 may bring about failures, such as short-circuiting or leakage caused by the above-described migration.

However, by the provision of the additional conductor film 53 shown in FIG. 2, as well as by the provision of the additional conductor film 42 shown in FIG. 1, the above-described failures are reliably prevented. The additional conductor film 53 also increases the resistance against the peeling-off or dropping of the external conductor film 31.

Figure 3:
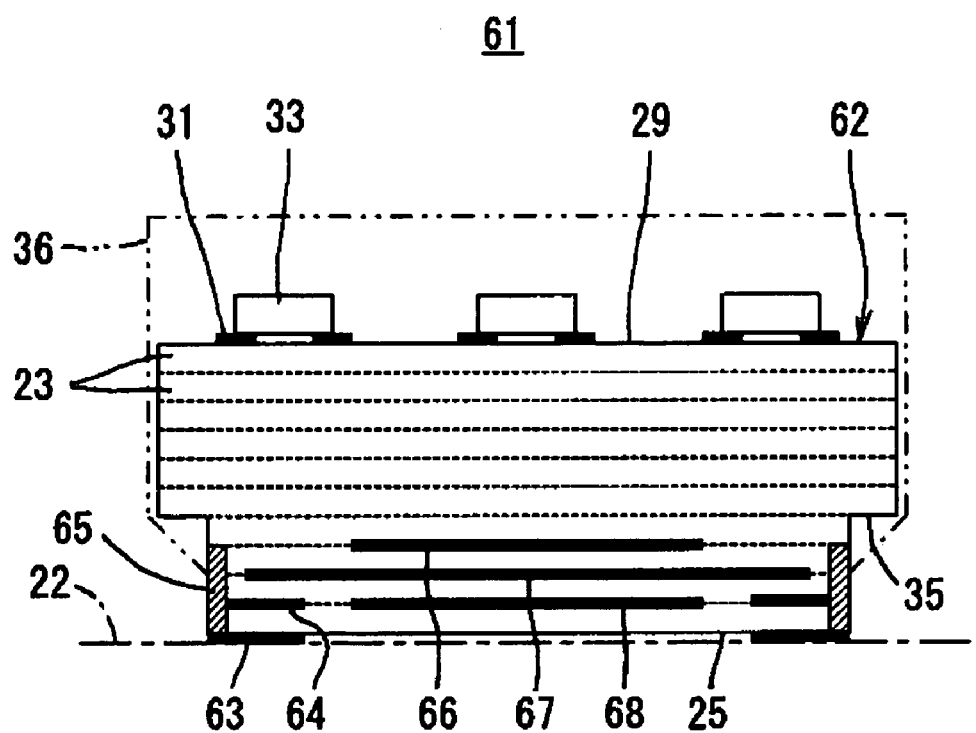
FIG. 3 is a sectional view illustrating a laminated electronic component 61 according to a third preferred embodiment of the present invention.

FIG. 3 is a sectional view illustrating a laminated electronic component 61 constructed in accordance with a third preferred embodiment of the present invention. In FIG. 3, elements equivalent to those shown in FIG. 1 are designated with like reference numerals, and an explanation thereof is thus omitted.

In a laminated block 62 provided for the laminated electronic component 61 shown in FIG. 3, an external conductor film 63, which defines an input/output terminal for establishing an electrical connection with the mounting board 22, is provided on the first main surface 25 facing the mounting board 22. An additional conductor film 64 is disposed along the specific interface between the insulating layers 23 such that it faces the external conductor film 63.

The additional conductor film 64 and the external conductor film 63 are electrically connected to each other via a conductor 65 disposed on an outer surface, for example, a side surface, of the laminated block 62 so that they are at the same potential. The conductor 65 can be formed in a manner substantially similar to the terminal conductor 34 shown in FIG. 1.

In FIG. 3, internal conductor films 66, 67, and 68 are arranged to define the internal conductor films located within the laminated block 62. The internal conductor films 66, 67, and 68 have the function of forming capacitors or providing a ground potential or wiring, and thus, a constant DC bias is sometimes applied to the external conductor film 63. Accordingly, any crack occurring adjacent to the insulating layer 23 of the external conductor film 63 may bring about failures, such as short-circuiting or leakage caused by the above-described migration.

However, by the provision of the additional conductor film 64 shown in FIG. 3, as well as by the provision of the additional conductor film 42 shown in FIG. 1, the above-described failures are reliably prevented.

Figure 4:
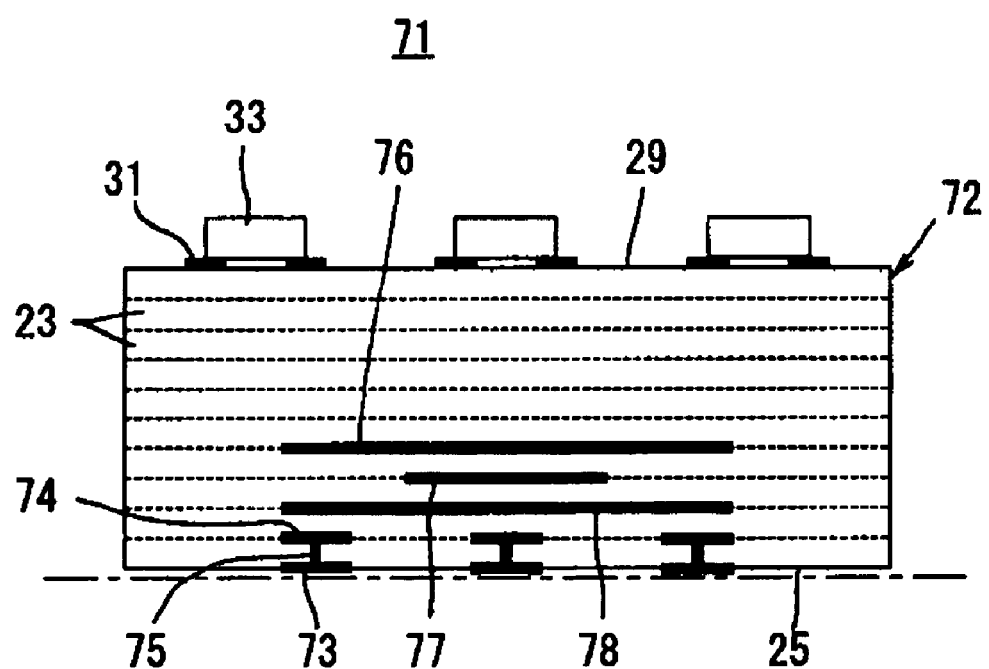
FIG. 4 is a sectional view illustrating a laminated electronic component 71 according to a fourth preferred embodiment of the present invention.
Figure 5:
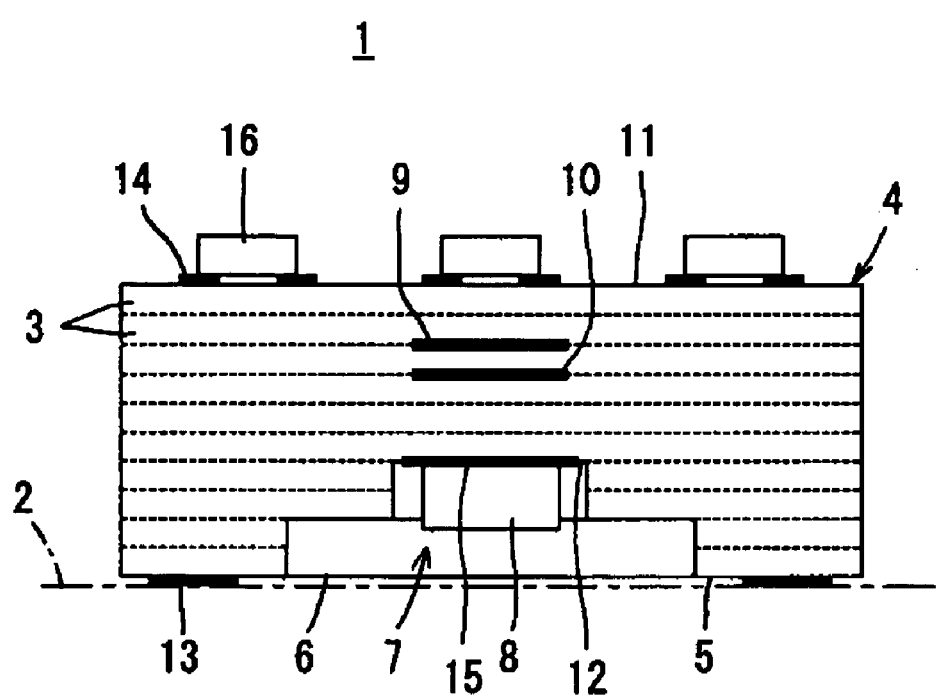
FIG. 5 is a sectional view illustrating a known laminated electronic component 1.

FIG. 4 is a sectional view illustrating a laminated electronic component 71 constructed in accordance with a fourth preferred embodiment of the present invention. In FIG. 4, elements equivalent to those shown in FIG. 1 are indicated by like reference numerals, and an explanation thereof is thus omitted.

In a laminated block 72 provided for the laminated electronic component 71 shown in FIG. 4, an external conductor film 73 structured as, for example, a land grid array (LGA), is provided on the first main surface 25 facing the mounting board 22. The external conductor film 73 is used for establishing an electrical connection with the mounting board 22. An additional conductor film 74 is disposed along the specific interface between the insulating layers 23 such that it faces the external conductor film 73. The additional conductor film 74 and the external conductor film 73 are electrically connected to each other through a via-hole conductor 75 so that they are at the same potential.

In FIG. 4, internal conductor films 76, 77, and 78 are provided as the internal conductor films formed within the laminated block 72. The internal conductor films 76, 77, and 78 have the function of forming capacitors or providing a ground potential or wiring, and thus, a constant DC bias is sometimes applied to the external conductor film 73. Accordingly, any crack occurring adjacent to the insulating layer 23 of the external conductor film 73 may bring about failures, such as short-circuiting or leakage caused by the above-described migration.

However, by the provision of the additional conductor film 74 shown in FIG. 4, as well as by the provision of the additional conductor film 42 shown in FIG. 1, the above-described failures are reliably prevented. The additional conductor film 74 also increases the resistance against the peeling-off or dropping of the external conductor film 73.

While the present invention has been described through illustration of preferred embodiments with reference to the accompanying drawings, various modifications and changes can be made without departing from the spirit of the invention.

For example, the number of laminated insulating layers, or the arrangement of internal conductor films, via-hole conductors, and external conductor films provided for a laminated block may be changed as desired according to the design of a laminated electronic component.

Additionally, the characteristic configurations of the first through fourth preferred embodiments may be combined suitably.

In the foregoing preferred embodiments, a single additional conductor film is provided for a single external conductor film. However, if a plurality of external conductor films are disposed adjacent to each other and are at the same potential, a common additional conductor film may be provided for the plurality of external conductor films such that it faces the external conductor films.

What is claimed is:

1. A laminated electronic component comprising:
a laminated block including a plurality of electrically insulating layers and an internal conductor film disposed between the insulating layers laminated together in a thickness direction of said laminated block;
an external conductor film disposed on an exposed surface of said laminated block; and
an additional conductor film which is at the same electric potential as said external conductor film and which is arranged along a specific interface between the insulating layers such that said additional conductor film faces said external conductor film; wherein
said insulating layers are formed of ceramic material; and
the thickness of the insulating layer between said additional conductor film and said external conductor film ranges from about 25 µm to about 150 µm.

2. A laminated electronic component comprising:
a laminated block including a plurality of electrically insulating layers and an internal conductor film disposed between the insulating layers laminated together in a thickness direction of said laminated block;
an external conductor film disposed on an exposed surface of said laminated block; and
an additional conductor film which is at the same electric potential as said external conductor film and which is arranged along a specific interface between the insulating layers such that said additional conductor film faces said external conductor film; wherein
said insulating layers are formed of ceramic material;
the area of said additional conductor film is greater than or equivalent to the area of said external conductor film, and is arranged such that said additional conductor film covers said external conductor film therein when viewed from above or below;
the external conductor film defines one of a die bonding surface and a land for mounting; and
the thickness of the insulating layer between said additional conductor film and said external conductor film ranges from about 10 µm to about 150 µm.

3. A laminated electronic component according to claim 2, wherein only one of the insulating layers is interposed between said additional conductor film and said external conductor film.

4. A laminated electronic component according to claim 2, wherein said additional conductor film and said external conductor film are electrically connected to each other through a via-hole conductor.

5. A laminated electronic component according to claim 2, wherein a DC bias is applied between said external conductor film and said internal conductor film.

6. A laminated electronic component according to claim 2, wherein said laminated block includes a first main surface and a second main surface facing the first main surface, and said external conductor film is disposed on at least one of the first and second main surfaces.

7. A laminated electronic component according to claim 2, wherein said internal conductor film defines at least one of a capacitor, a ground potential and a wiring for connection to an electronic component.

8. A laminated electronic component according to claim 2, further comprising a plurality of internal conductors and via-hole conductors which are arranged to provide at least one of wiring patterns, capacitors, inductors, delay lines, and filters.

9. A laminated electronic component according to claim 2, further comprising resistor films for defining resistors.

10. A laminated electronic component according to claim 6, further comprising a chip component mounted on at least one of the first and second main surfaces, wherein said external conductor film is arranged to establish an electrical connection with said chip component.

11. A laminated electronic component according to claim 6, wherein said external conductor film is arranged to establish an electrical connection with a board on which said laminated electronic component is mounted.

12. A laminated electronic component according to claim 8, wherein the plurality of internal conductors and via hole conductors are disposed within said laminated block.

13. A laminated electronic component according to claim 9, wherein said resistor films are disposed within said laminated block.

14. A laminated electronic component according to claim 10, wherein said chip component is one of a capacitor, an inductor, a resistor, a diode, an integrated circuit, a memory device, a SAW filter and a quartz oscillator.

15. A laminated electronic component comprising:
a laminated block including a plurality of electrically insulating layers and an internal conductor film disposed between the insulating layers laminated together in a thickness direction of said laminated block;
an external conductor film disposed on an exposed surface of said laminated block; and
an additional conductor film which is at the same electric potential as said external conductor film and which is arranged along a specific interface between the insulating layers such that said additional conductor film faces said external conductor film; wherein
said insulating layers are formed of ceramic material; and
said additional conductor film and said external conductor film are electrically connected to each other through a conductor disposed on an outer surface of said laminated block.

16. A laminated electronic component comprising:
a laminated block including a plurality of electrically insulating layers and an internal conductor film disposed between the insulating layers laminated together in a thickness direction of said laminated block;
an external conductor film disposed on an exposed surface of said laminated block; and
an additional conductor film which is at the same electric potential as said external conductor film and which is arranged along a specific interface between the insulating layers such that said additional conductor film faces said external conductor film; wherein
a cavity having an opening positioned on at least one of main surfaces of said laminated block is provided in said laminated block, and said external conductor film is disposed on the bottom surface of the cavity; and
said insulating layers are formed of ceramic material.

17. A laminated electronic component according to claim 16, further comprising a chip component housed in the cavity, wherein said external conductor film defines a die bonding surface for bonding the chip component.

18. A laminated electronic component according to claim 16, wherein said additional conductor film and said external conductor film are electrically connected to each other through a via-hole conductor, and the via-hole conductor is positioned in an area outside the bottom surface of the cavity.

* * * * *